United States Patent [19]
Mashiro et al.

[11] Patent Number: 5,699,223
[45] Date of Patent: Dec. 16, 1997

[54] METHOD OF REMOVING SUBSTRATE AND APPARATUS FOR CONTROLLING APPLIED VOLTAGE

[75] Inventors: Supika Mashiro, Saitama-Prefecture; Kiyotaka Sakamoto, Tokyo, both of Japan

[73] Assignee: Anelva Corporation, Fuchu, Japan

[21] Appl. No.: 409,991

[22] Filed: Mar. 24, 1995

[30] Foreign Application Priority Data

Apr. 27, 1994 [JP] Japan .................................. 6-090132

[51] Int. Cl.$^6$ .................................................. H02N 13/00
[52] U.S. Cl. .................................................. 361/234
[58] Field of Search ................................ 361/234, 230, 361/233, 235; 269/8; 279/128

[56] References Cited

U.S. PATENT DOCUMENTS

| | | |
|---|---|---|
| 4,948,458 | 8/1990 | Ogle . |
| 4,968,374 | 11/1990 | Tsukada et al. . |
| 4,990,229 | 2/1991 | Campbell et al. . |
| 5,091,049 | 2/1992 | Campbell et al. . |
| 5,110,438 | 5/1992 | Ohmi et al. .................... 156/345 X |
| 5,117,121 | 5/1992 | Watanabe et al. . |
| 5,226,967 | 7/1993 | Chen et al. . |
| 5,378,311 | 1/1995 | Nagayama et al. ............. 156/345 X |
| 5,459,632 | 10/1995 | Birang et al. .................... 361/234 |
| 5,463,525 | 10/1995 | Barnes et al. .................... 361/234 |
| 5,467,249 | 11/1995 | Barnes et al. .................... 361/234 |

FOREIGN PATENT DOCUMENTS

| | | |
|---|---|---|
| 55-090228 | 7/1980 | Japan . |
| 56-53853 | 12/1981 | Japan . |
| 5-291194 | 11/1993 | Japan . |

OTHER PUBLICATIONS

J. Hopwood, "Review of Inductively Coupled Plasmas for Plasma Processing", Plasma Sources Sci. Technol. 1, (1992), pp. 109–116.

Daniel L. Flamm, "Trends in Plasma Sources and Etching", Solid State Technology, Mar. 1991, pp. 47–50.

Brian Chapman, "Glow Discharge Processes Sputtering and Plasma Etching", published by John Wiley & Sons, New York, pp. 139–175.

Plasma Induced Damage During Contact Etch Process Using Mechanical and Electrostatic Chucks; Thien T. Nguyen et al; Jun. 7–8, 1994 VMIC Conference; pp. 228–234.

*Primary Examiner*—Fritz Fleming
*Attorney, Agent, or Firm*—Burns, Doane, Swecker & Mathis, LLP

[57] ABSTRACT

An apparatus for controlling the voltage applied to an electrostatic clamp enables a substrate removing method capable of rapidly, securely and safely removing a substrate regardless of the presence of a dielectric material on the back surface of the substrate to be processed. Before the substrate supported on an electrode by electrostatic clamping is removed, the potential difference between the substrate and the electrode is made zero, and plasma generation is then stopped. The apparatus for controlling the applied voltage has a circuit for detecting the maximum high-frequency voltage (Vpp) for generating a plasma, an operation circuit for computing the self-bias voltage (Vdc) from the maximum high-frequency voltage (Vpp), and an output control circuit for controlling the DC voltage output from a DC power source based on the self-bias voltage (Vdc).

17 Claims, 8 Drawing Sheets

METHOD OF REMOVING SUBSTRATE AND APPARATUS FOR CONTROLLING APPLIED VOLTAGE

BACKGROUND OF THE INVENTION

Field of the Invention

The present invention relates to a method capable of rapidly and securely removing a substrate, e.g., a semiconductor wafer, which is held on an electrode by electrostatic clamping, and an apparatus for controlling the voltage applied to an electrostatic clamp for effectively performing the removal method.

Description of the Related Art

A method of holding a substrate by electrostatic clamping is capable of fixing the substrate by a uniform force applied over the entire surface thereof without disturbing plasma processing of the substrate. Since this method is basically suitable for holding a large substrate, it is increasingly widely used in the process of fabricating semiconductor devices with the tendency toward a large-diameter semiconductor wafer.

A known method of removing the substrate fixed by electrostatic clamping force employs the technique of releasing the residual static charge remaining in a dielectric material provided on an electrode by grounding the electrode and the processed substrate after the completion of plasma processing (Japanese Patent Laid-Open No. 5-291194).

However, the technique of grounding both the electrostatic clamping electrode and the processed substrate has a problem in that in the case of a dielectric film, e.g., a $SiO_2$ film, being present on the back surface of the substrate, a long time is required to completely eliminate the residual static charge remaining in the dielectric film, i.e., completely discharging the film. The time required to discharge is determined by the time decay constant depending upon the thickness of the dielectric film and the volume resistivity thereof. For example, this method requires about 150 seconds for removing a 6-inch semiconductor wafer with a $SiO_2$ film which has a thickness of 1 μm and which is formed on the back surface thereof.

Another known method of removing a substrate employs the technique of making the DC voltage applied to the electrostatic clamping electrode zero and then exposing the substrate to a plasma for discharging the static charge contributing to clamping force. However, since the substrate is exposed to a plasma, the temperature of the substrate might rise. In addition, although the electrostatic clamping force temporarily becomes zero or substantially zero by stopping application of the DC voltage to the electrode (decreasing the DC voltage equal to zero), the electrostatic clamping force then begins to reappear due to a self-bias voltage. As shown in the graphs of FIGS. 5 and 6, after point c where the electrostatic clamping force is zero or reaches substantially zero, the electrostatic clamping force reappears due to the self-bias voltage induced in the substrate by the plasma, as shown by curve A in FIGS. 5 and 6. It is thus necessary to remove the substrate from the electrode at point c or near point c. However, the actual time required from the stoppage of application of the DC voltage to the time the electrostatic clamping force becomes zero (substantially zero), i.e., the period of time from point b to point c, is not constant. This period of time is easily affected by the type of the substrate or process conditions. It is thus difficult to find the optimum time for removing the substrate. For this reason, the technique for rapidly, securely and safely removing the substrate is difficult.

A further known method of removing the substrate employs the technique of stopping the DC voltage applied to the electrostatic clamping electrode, and then grounding the substrate while exposing it to a plasma. This technique can prevent a self-bias voltage from being induced in the substrate due to the plasma after the application of the DC voltage is stopped. However, the technique has a problem in that in the case of a dielectric film being present on the back surface of the substrate, if plasma generation is not timely stopped, a long time is required to completely eliminate the static charge induced again in the dielectric film.

OBJECTS AND SUMMARY

The present invention has been achieved in consideration of the above-described problems. An object of the invention, therefore, is to provide a method of rapidly, securely and safely removing a substrate electrostatically clamped, regardless of the presence of a dielectric material on the back surface of the substrate to be processed. Another object of the invention is to provide an apparatus for controlling the voltage applied to an electrostatic clamp to effectively perform the removal method.

In order to achieve the object, the present invention provides a method of removing a substrate held on an electrode by an electrostatic clamping force generated by a potential difference between a DC voltage applied to an electrode and a negative self-bias voltage induced in the substrate due to a plasma. Before removing the substrate, the DC voltage is controlled to set the potential difference to a value causing no damage to the substrate at the time of removal thereof, and plasma generation is then stopped after the potential difference is set to the value.

Plasma is generated by applying a radio frequency rf (13.56MHz) between opposite parallel plate electrodes. The plasma can also be produced by electron cyclotron resonance (ECR), helicon wave disclosed in U.S. Pat. Nos. 4,990,229 and 5,091,049, or inductive coupling disclosed in U.S. Pat. No. 5,226,967.

Before the substrate held on the electrode by electrostatic clamping force is removed, the potential difference between the substrate and the electrode is set to about 100 V or less by controlling the DC voltage. If the potential difference is about 100 V or less, the substrate can be removed without damage thereto.

It is preferable that before the substrate held on the electrode by electrostatic clamping is removed, the potential difference between the electrode and the substrate is reduced, possibly even to zero, by controlling the DC voltage, and plasma generation is then stopped after the potential difference is reduced. The potential difference is generated between the DC voltage applied to the electrode and the negative self-bias voltage induced in the substrate due to the plasma. This potential difference induces an electrostatic clamping force between the substrate and the electrode. When this potential difference is reduced to zero, the static charge stored between the substrate and the electrode is discharged into the plasma to dissipate. In order to remove the substrate without having any residual static charge remaining, the potential difference between the substrate and the electrode should be made zero before stopping plasma generation. It is preferable to make the potential difference zero in order to make the DC voltage equal to the negative self-bias voltage immediately before stopping plasma generation.

In the case where the electrode is grounded (the electrode potential is zero) so that the substrate is electrostatically clamped to the electrode only by the negative self-bias voltage induced in the substrate, the DC voltage is applied to the electrode to make the potential difference thereof zero before the substrate is removed, and plasma generation is then stopped after the potential difference is made zero. In this case, the DC voltage equal to the negative self-bias voltage is preferably applied to the electrode immediately before stopping plasma generation.

When the potential difference between the substrate and the electrode is made zero, the electrostatic clamping force acting therebetween becomes zero a little later. In order to completely eliminate the remnant clamping force caused by the residual static charge before the substrate is removed, it is thus preferable to make the electrostatic clamping force zero just before the plasma generation is stopped. It is further preferable to stop the application of the DC voltage to the electrode as soon as the plasma generation is stopped before the substrate is removed from the electrode.

DETAILED DESCRIPTION OF THE PREFERRED EMBODIMENTS

An apparatus for controlling the voltage applied to the electrostatic clamp is provided with means for controlling the voltage in response to a self-bias voltage (Vdc). The apparatus is preferably comprised of a DC power source for applying the DC voltage to the electrode to generate an electrostatic clamping force between the substrate and the electrode, a circuit for detecting the voltage (Vpp) of a high frequency for generating the plasma, a circuit for computing the self-bias voltage (Vdc) from the maximum high-frequency voltage (Vpp), and a circuit for controlling the DC voltage output from the DC power source, based on the self-bias voltage (Vdc). Particularly, the output control circuit functions to make the DC voltage equal to the self-bias voltage immediately before processing of the substrate is completed. This function makes the method of removing the substrate of the present invention effective.

The detection circuit for measuring the maximum high frequency voltage (Vpp) and the operation circuit for computing the self-bias voltage (Vdc) from the maximum (Vpp) function cooperative to estimate the self-bias voltage induced during plasma generation. Since a dielectric material is used in the electrostatic clamping electrode, the self-bias voltage cannot be measured directly in processing of the substrate. However, since the maximum voltage (Vpp) of the high frequency for generating the plasma can be measured, the self-bias voltage (Vdc) can be determined from the maximum voltage (Vpp). Within a wide range of process conditions, the following linear equation (1) generally establishes a relationship between the self-bias voltage (Vdc) and the maximum voltage (Vpp):

$$Vdc = aVpp + b \tag{1}$$

wherein a and b are constants.

If the electrode is made of a conductive material, Vdc can be measured directly. Since Vdc and Vpp can be measured by using a conductive electrode, the constants a and b can be previously determined. The operation circuit determines Vdc from Vpp based on equation (1). If a linear equation is not established, Vdc is measured for each Vpp, and the data of Vdc corresponding to Vpp is beforehand memorized in the operation circuit.

The DC power source is provided with a filter for cutting the frequency for generating the plasma.

The electrostatic clamping force F acting on the substrate is given by the following equation (2):

$$F = (K)(Vd - Vdc)^2 \tag{2}$$

wherein K is a constant and Vd is the voltage applied to the electrode.

Figure 7:
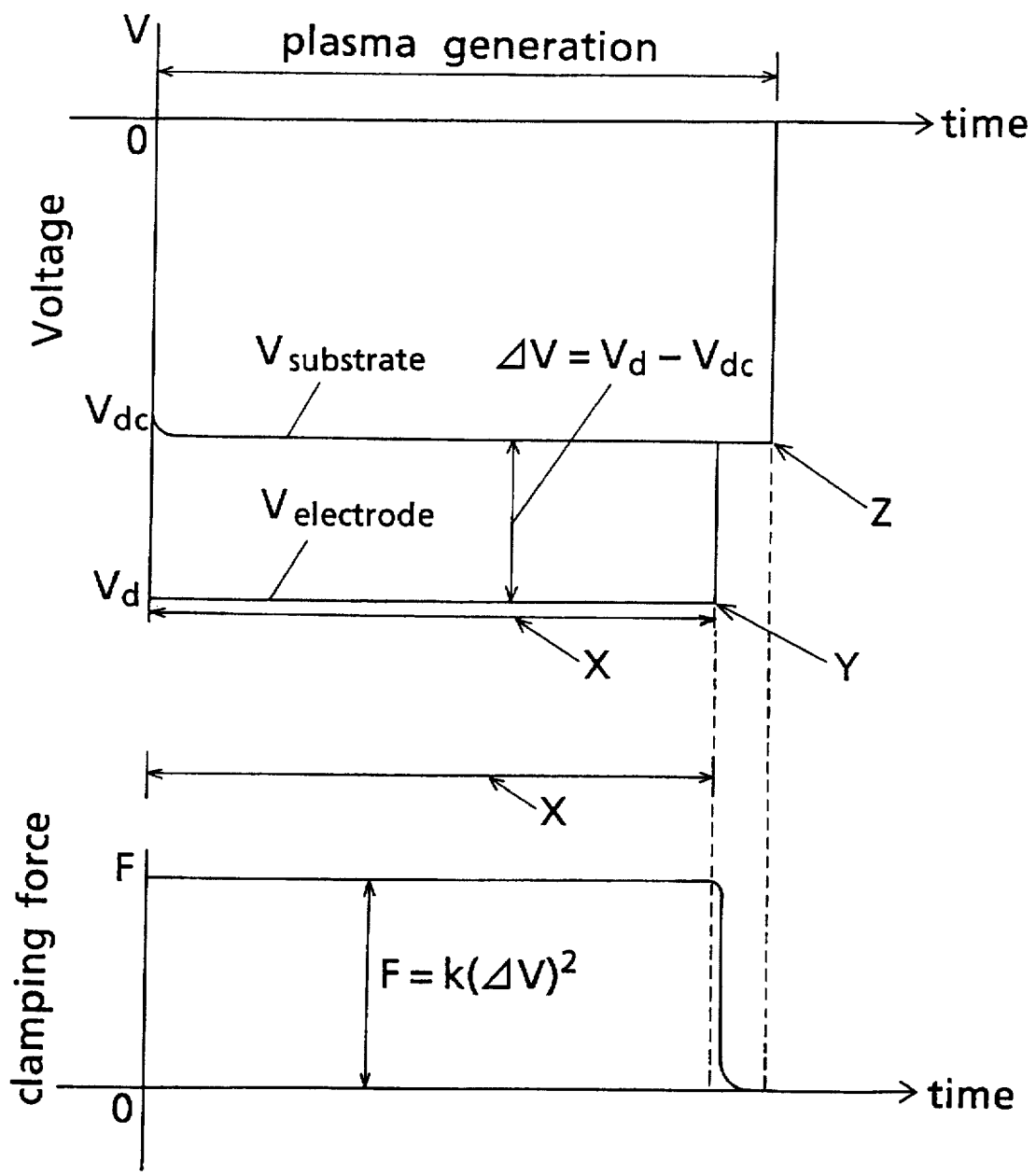
FIG. 7 is a graph showing changes in voltages of a substrate and an electrode, and an electrostatic clamping force, with the passage of time.

FIG. 7 shows changes in the voltages of the substrate and the electrode (upper graph), and the electrostatic clamping force acting therebetween (lower graph) with the passage of time.

During period X, the self-bias voltage Vdc is induced in the substrate due to the plasma. The substrate voltage $V_{SUBSTRATE}$ is the self-bias voltage Vdc, and the electrode voltage $V_{SUBSTRATE}$ is the applied DC voltage Vd. The potential difference ΔV between the electrode and the substrate is $\Delta V = V_{eELECTRODE} - V_{SUBSTRATE} = VD - Vdc$. This potential difference generates the electrostatic clamping force $F = K(\Delta V)^2$ (equation (2)) between the substrate and the electrode.

The electrode voltage $V_{ELECTRODE}$ is set to Vdc by adjusting the DC voltage at time Y. When $V_{ELECTRODE} = Vdc$, the potential difference ΔV=×0, and a little later, the electrostatic clamping force F =0. Only a little more time is taken for making the electrostatic clamping force zero, possibly due to the time required for completing discharge into the plasma. The potential difference ΔV is maintained at zero (ΔV =0) throughout time Y to time Z for stoppage of plasma generation by the apparatus for controlling the applied voltage.

Figure 8:
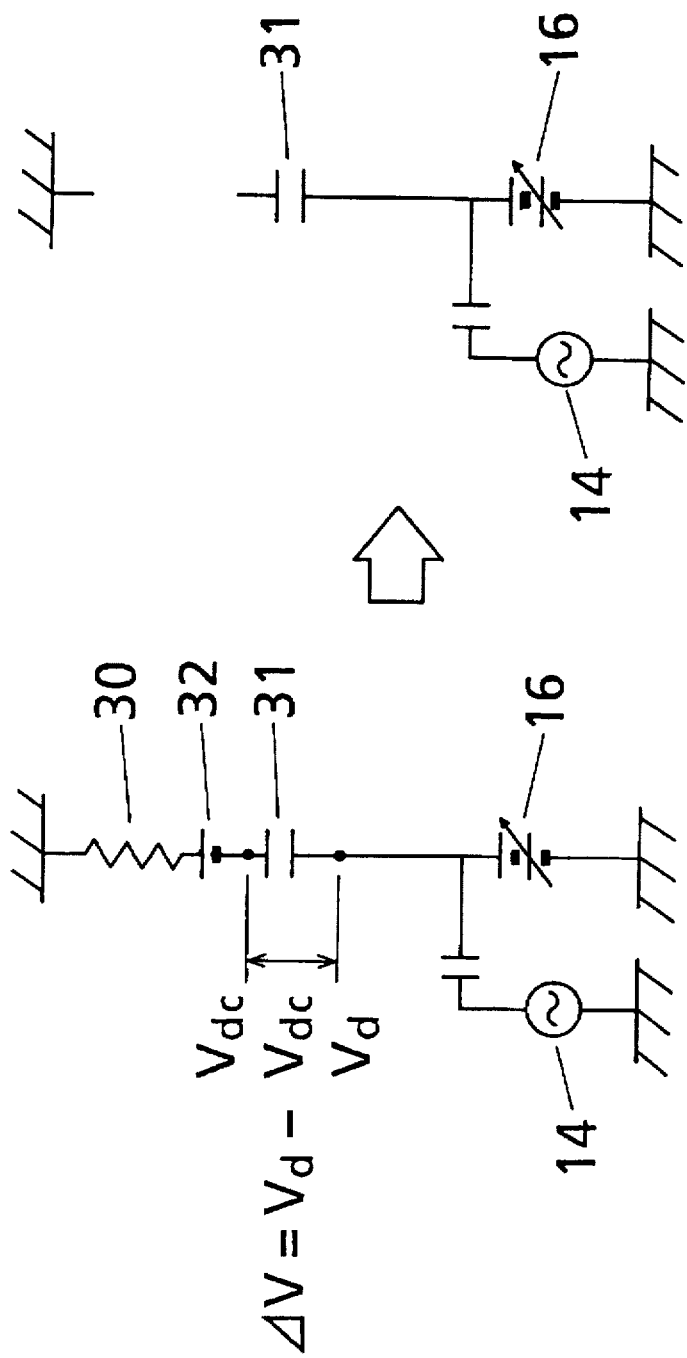
FIG. 8 is a drawing illustrating equivalent circuit models during plasma generation and after plasma disappearance.

Plasma generation is stopped at time Z. Since plasma generation is stopped without having any charge remaining between the substrate and the electrode (the amount of static charge Q=0), the electrostatic clamping force does not remain due to the residual static charge between the substrate and the electrode. After plasma generation is stopped, the self-bias voltage induced in the substrate becomes zero. After plasma generation is stopped, the electrode voltage apparently becomes zero even if the DC power source is not cut off. The reason why the electrode voltage becomes zero can be explained by using an equivalent circuit model. During plasma generation, an equivalent circuit model, as shown on the left of FIG. 8, is established. In FIG. 8, reference numeral 14 denotes an rf power source, and reference numeral 16 denotes a variable DC power source. A capacitor 31 corresponds to the amount of the static charge between the substrate and the electrode, a resistance 30 corresponds to the plasma, and a power source 32 corresponds to the self-bias voltage. After plasma generation is stopped, since the resistance 30 corresponding to the plasma and the power source 32 corresponding to the self-bias voltage disappears, as shown on the right of FIG. 8, the wiring of the equivalent circuit is open or cut. No current flows due to the open circuit, and thus no voltage is applied to the electrode. However, even in the open wiring shown on the right side of FIG. 8, when a grounded transfer robot secures the substrate while the DC power source remains turned on, the DC voltage is applied to the electrode. The application of the voltage to the electrode causes a potential difference between the electrode and the substrate (the substrate voltage is zero) because an equivalent circuit through which current flows is established due to the contact between the grounded transfer robot and the substrate. This potential difference causes the electrostatic clamping force to act on the substrate when the substrate is removed from the electrode by the transfer robot. In order to prevent such a problem, the DC power source should be turned off before the substrate is removed from the electrode.

If plasma generation is stopped without making the potential difference between the substrate and the electrode zero, i.e., if time reaches point Z immediately after period X, the substrate voltage $V_{SUBSTRATE}=0$, and the electrode voltage $V_{ELECTRODE}=0$. Although the electrostatic clamping force F seems at a glance to be zero, as shown in FIG. 7, a residual static charge $Q_{RESIDUE}$ actually remains between the substrate and the electrode after plasma generation is stopped. When the substrate is removed, therefore, the residual clamping force $F^{RESIDUE}$ remains due to the residual static charge. The reason that an electrostatic charge remains is that the electrostatic charge is not discharged into the plasma before stopping plasma generation. It is thus preferable for the present invention to discharge the static charge between the substrate and the electrode into the plasma.

In the present invention, the electrode potential is made equal to the self-bias voltage by controlling the DC power source connected to the electrode immediately before processing is completed. In removal of the substrate, the electrostatic clamping force is kept at zero.

Figure 1:
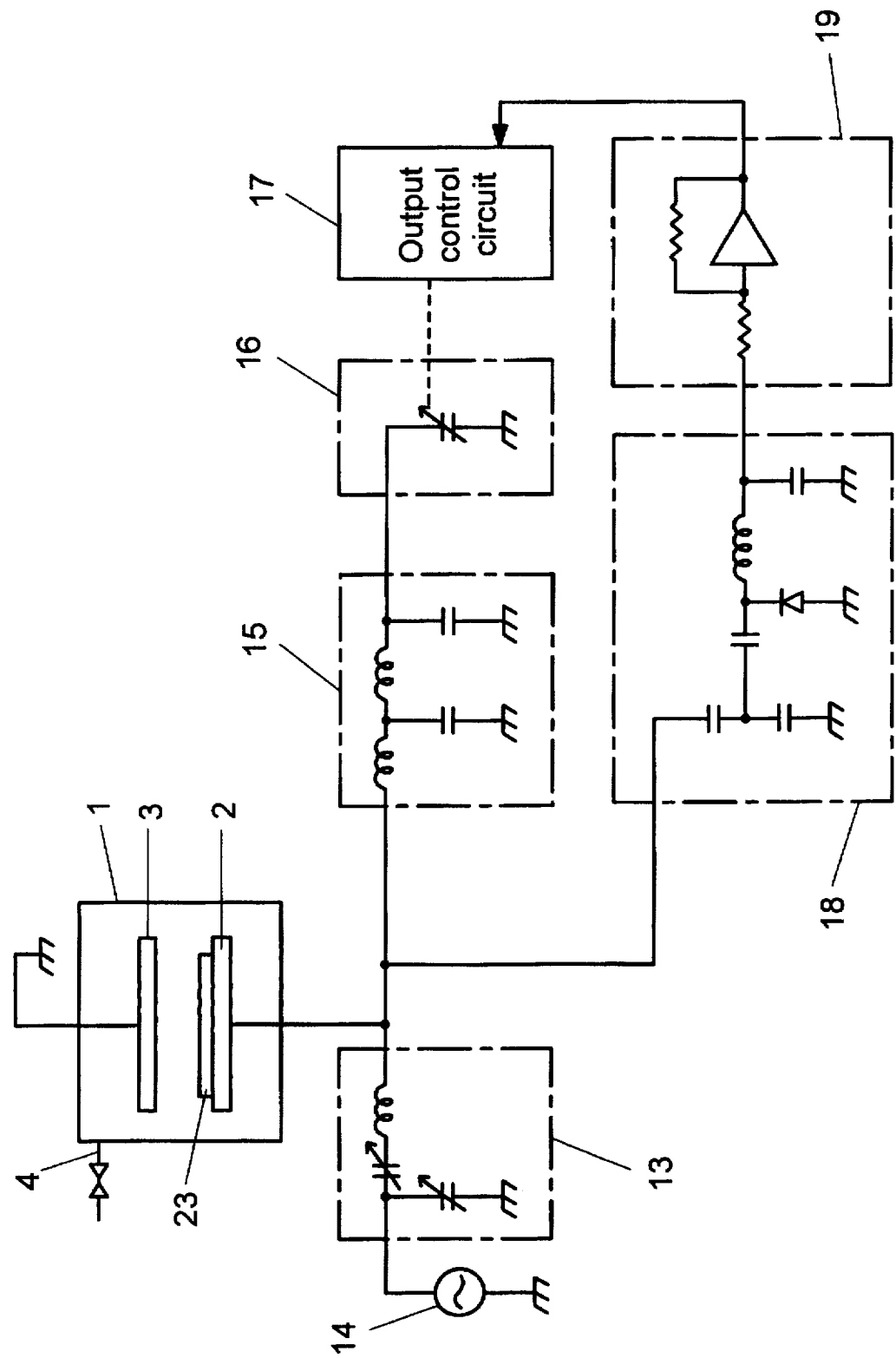
FIG. 1 is a block diagram of a preferred embodiment in which the present invention is built in a parallel plate dry etching apparatus.

FIG. 1 shows a parallel plate dry etching apparatus including a controller for the applied voltage in accordance with a first embodiment of the present invention. In FIG. 1, a vacuum chamber 1 has a base 2 on which a substrate 23, e.g., a semiconductor wafer, is mounted. A counter electrode 3 is disposed opposite to the base 2. A pipe 4 for introducing etching gas and a vacuum pump (not shown) are connected to the vacuum chamber 1.

Figure 2:
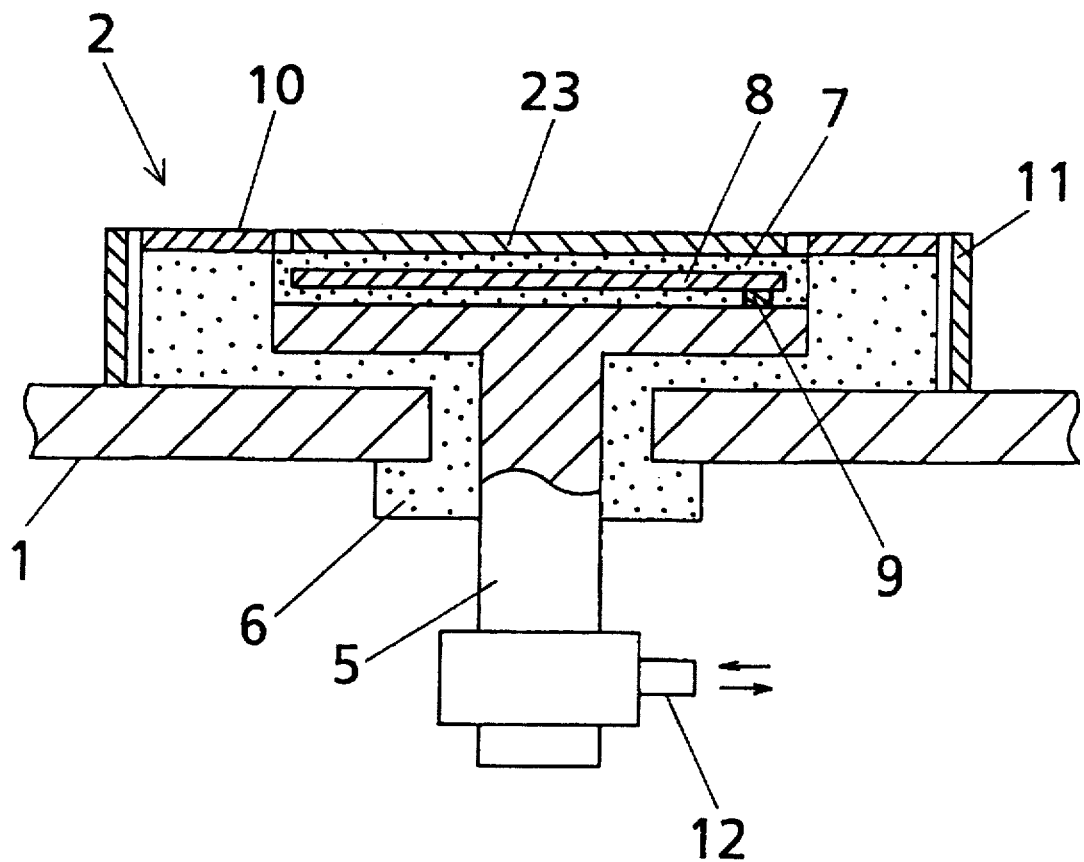
FIG. 2 is an enlarged sectional view illustrating a substrate mounting base of the same embodiment.

As illustrated in FIG. 2, the substrate mounting base 2 comprises as a body a high-frequency applying electrode 5 which passes through a bottom wall of the vacuum chamber 1. The outside of the high-frequency applying electrode 5 is covered with an insulator 6, except for the upper surface thereof. The sides of the insulator 6 are surrounded by a shield 11, and the upper side of the insulator 6 is covered with a synthetic resin cover 10. On the upper side of the high-frequency applying electrode 5 is provided a dielectric material 7 having a thickness of about 300 μm, in which an electrostatic clamping electrode 8 is embedded. The dielectric material 7 includes, as a main component, alumina containing titanium oxide. The high-frequency applying electrode 5 and the electrostatic clamping electrode 8 are connected to each other in direct current through a conductive member 9. On the portion of the high-frequency applying electrode 5 which projects outward is provided an inlet/outlet 12 for circulating cooling water in a passage (not shown) in the high-frequency applying electrode 5.

An rf (13.56 MHz) power source 14 is connected to the high frequency applying electrode 5 through a matching network 13. A DC power source 16 for electrostatic clamping is also connected to the high-frequency applying electrode 5 through a high frequency cut filter circuit 15. The output voltage from the DC power source 16 is changed by an output control circuit 17. A detection circuit 18 is also connected between the high frequency applying electrode 5 and the earth so as to detect the maximum high-frequency voltage (Vpp) therebetween. The output signal of the detection circuit 18 is supplied to an operation circuit 19 for computing the self-bias voltage (Vdc). The output signal of the operation circuit 19 is input to the output control circuit 17.

Figure 3:
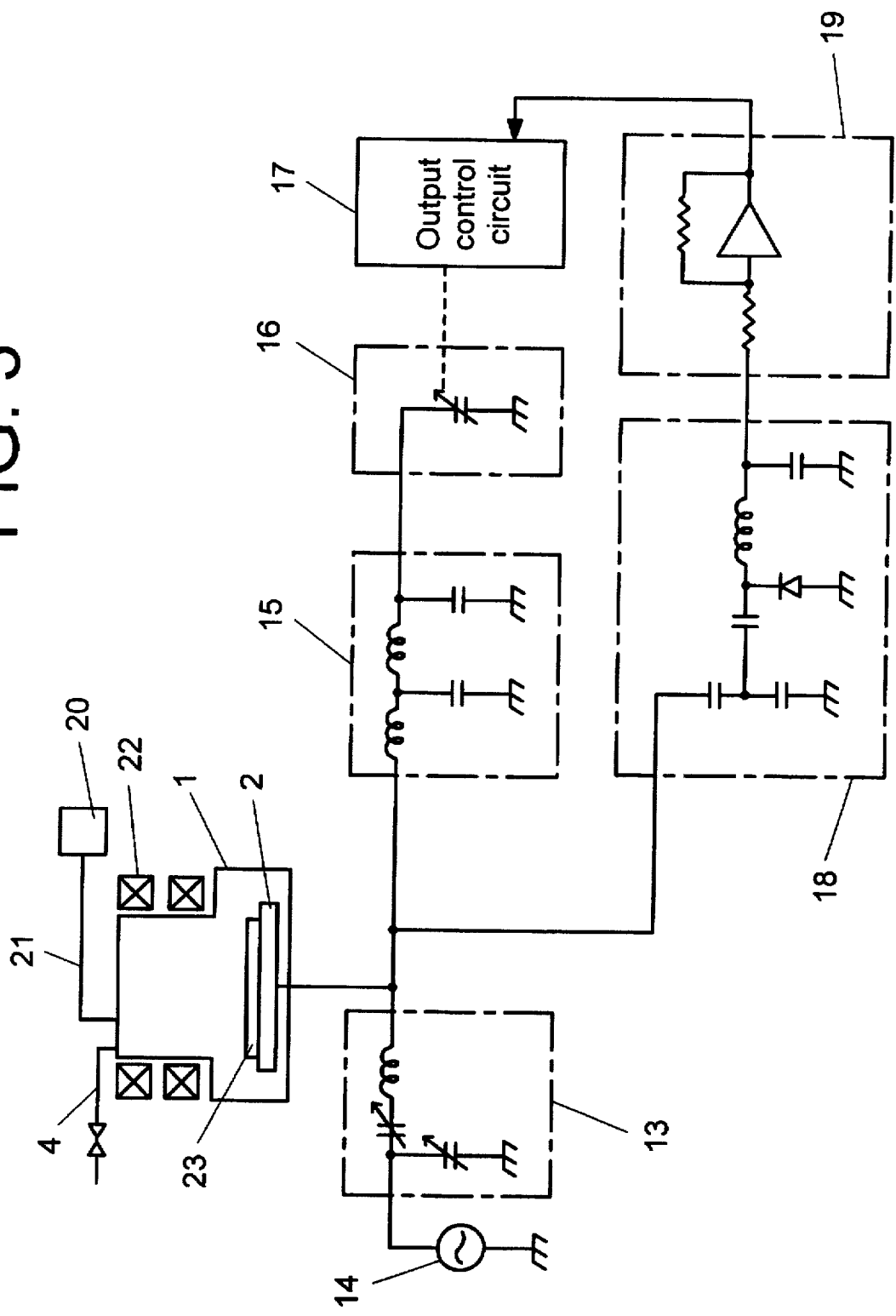
FIG. 3 is a block diagram of a preferred embodiment in which the present invention is built into an ECR processing apparatus.

FIG. 3 illustrates a second embodiment in which an ECR processing apparatus for processing a substrate with ECR plasma includes a controller for the applied voltage. A microwave (2.45 GHz) power source 20 is connected to a vacuum chamber 1 through a waveguide 21. A coil ring 22 is provided outside the vacuum chamber 1 so that a magnetic field (875 Gauss) can be applied to the inside of the vacuum chamber 1. Since the other construction is the same as that shown in FIGS. 1 and 2, the same members are denoted by the same reference numerals.

In this embodiment, the vacuum chamber 1 is evacuated, and a process gas is introduced into the vacuum chamber 1 through the pipe 4 to set the pressure of the process gas to a predetermined value, preferably $10^{-3}$ to $10^{-6}$ Torr. An ECR plasma is generated in the vacuum chamber 1 under predetermined pressure through the microwave power source 20. The substrate 23 mounted on the base 2 is subjected to surface processing such as etching and deposition by using the ECR plasma.

In plasma processing, the substrate 23 is fixed to the substrate mounting base 2 by generating a potential difference between the substrate 23 and the electrostatic clamping electrode 8 with the dielectric material 7 therebetween. Since the negative self-bias voltage Vdc is produced in the substrate 23, the potential difference is induced by (a) grounding (ground voltage) the electrode 8, (b) causing the electrode 8 to have a negative DC potential having an absolute value greater than that of the negative self-bias voltage Vdc, or (c) causing the electrode 8 to have a DC potential (preferably plus potential) higher than the negative self-bias voltage Vdc. This potential difference generates the electrostatic clamping force on the substrate 23 based on the above equation (2), and the substrate 23 is clamped onto the substrate mounting base 2 by the electrostatic clamping force. The clamping of the substrate 23 to the substrate mounting base 2 permits the substrate 23 to be cooled with cooling water circulating in the passage in the high-frequency applying electrode 5 during plasma processing.

Immediately before the completion of the predetermined plasma processing, the processing end signal is sent to the output control circuit 17 and the potential difference is set to zero by adjusting the output voltage of the DC power source 16 equal to the self-bias voltage determined by both the detection circuit 18 and the operation circuit 19. This can make the electrostatic clamping force acting on the substrate 23 zero. When plasma generation is stopped immediately after the potential difference is set to zero, the substrate 23 can be removed from the substrate mounting base 2. Since plasma generation is stopped with the potential difference remaining at zero, the electrostatic clamping force does not reappear when the substrate 23 is removed. Since plasma generation is stopped after the static charge between the substrate and the electrode is made zero, no static charge remains in the dielectric material 7 between the substrate 23 and the electrode 8, as well as in the dielectric film formed on the back of the substrate 23, thereby causing no damage to the substrate due to the residual static charge at the time of removal of the substrate 23. Thus, the substrate can be rapidly, securely and safely removed by carrying out the present invention before removing the substrate. One method of separating the substrate from the electrode includes pushing the substrate with a pin provided on the substrate mounting base 2 at a position corresponding to the center of the substrate, as disclosed in Japanese Patent Application No. 6-48703.

Figure 4:
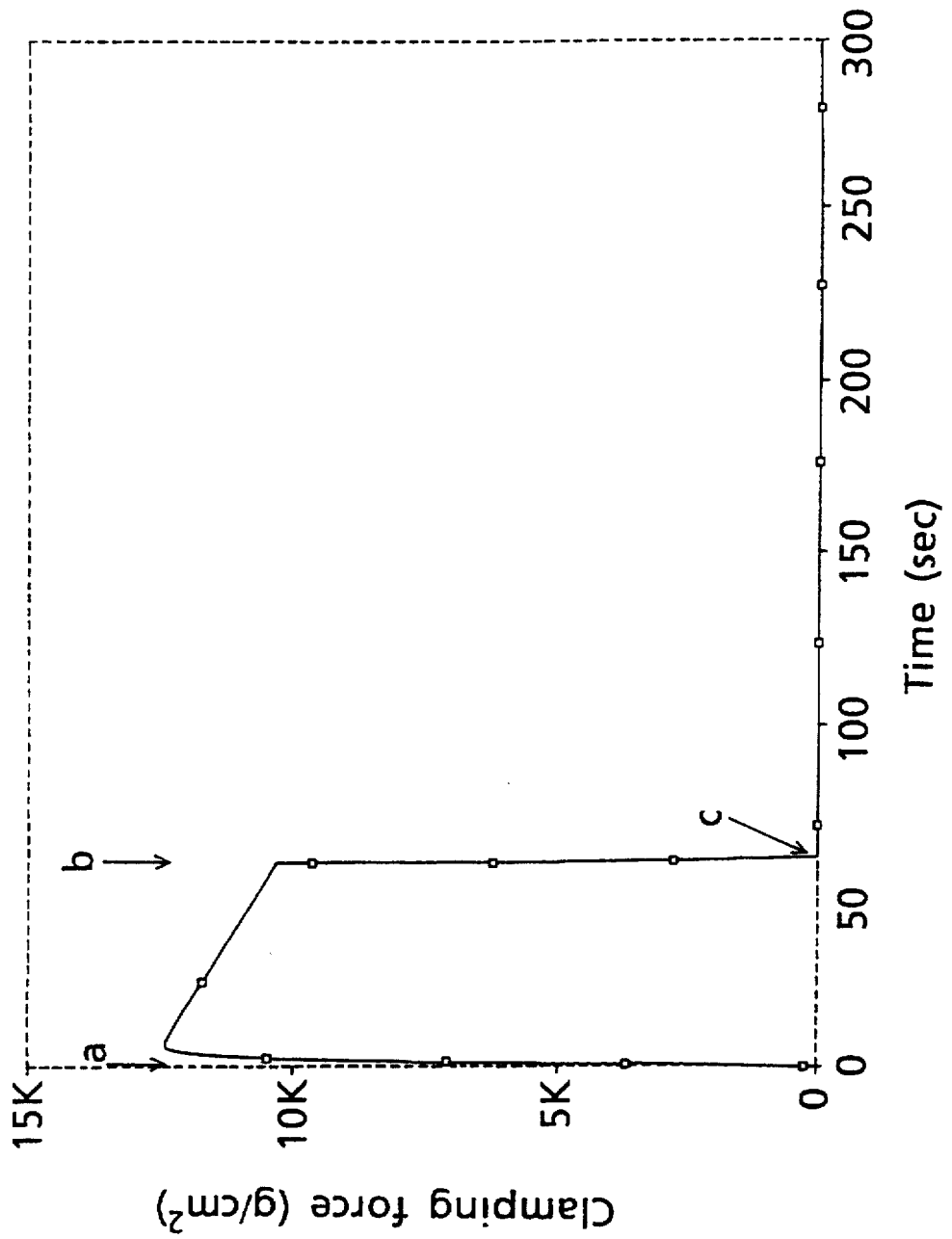
FIG. 4 is a graph showing changes in an electrostatic clamping force in a preferred embodiment of the present invention.
Figure 5:
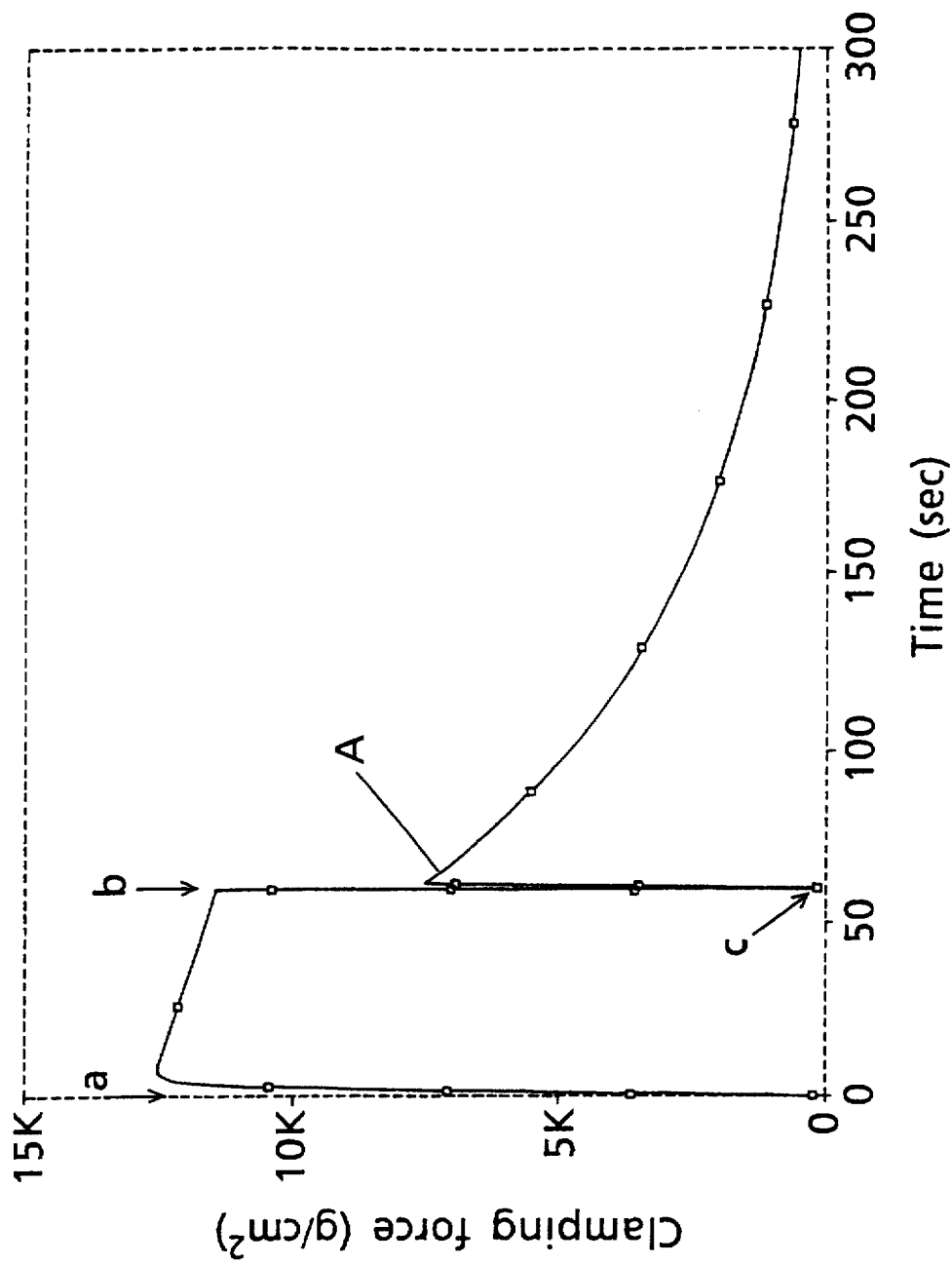
FIG. 5 is a graph showing changes in an electrostatic clamping force in the prior art.
Figure 6:
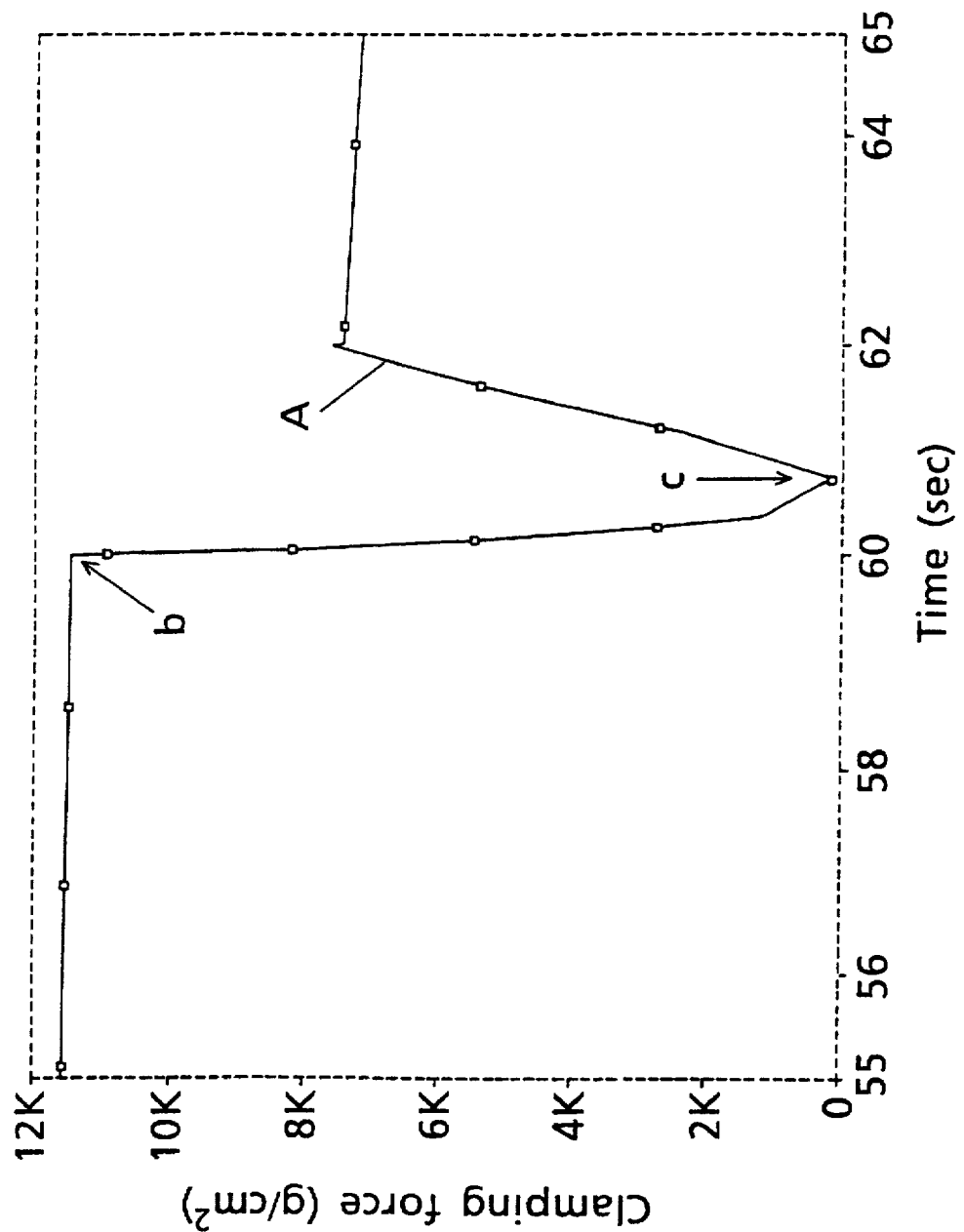
FIG. 6 is an enlarged graph showing a portion of FIG. 5.

FIG. 4 is a graph showing changes in the electrostatic clamping force acting on the substrate 23. The electrostatic clamping force is exerted on the substrate for the period from point a to point b.

FIG. 4 shows changes in the electrostatic clamping force for 60 seconds before plasma processing is completed. The plasma processing time depends upon the type of processing effected on the substrate 23, such as etching and sputtering, and process conditions such as the applied frequency and pressure.

The potential of the electrode 8 is set to a potential equal to the self-bias voltage at point b. The electrostatic clamping force becomes zero at point c to terminate the plasma processing (stop plasma generation). The electrostatic clamping force remains zero thereafter.

The present invention can maintain the electrostatic clamping force at zero after point c, and thus securely and safely remove the substrate by setting a sufficient time (1 to 2 seconds) from point b to point c.

However, the inventors confirmed that in the case where the potential difference between the substrate and the electrode is up to about 100 V, an 8-inch wafer substrate can be removed without damage thereto by pushing upward on the back thereof with four pins. This was confirmed by using the mechanical removal mechanism disclosed in Japanese Patent Application No. 6-48703.

As described above, since the present invention can make the electrostatic clamping force zero at the time of removal of the processed substrate, the substrate can be securely and safely removed without damage thereto. The present invention is effective to increase plasma processing throughput and improve productivity.

What is claimed is:

1. A method of removing a substrate held on an electrode by an electrostatic clamping force generated by a potential difference between a DC voltage applied to said electrode and a negative self-bias voltage induced in said substrate by a plasma, comprising the steps of:
   reducing said potential difference at or below a predetermined level to a value which causes no damage to said substrate at the time of removal thereof, by controlling said DC voltage,
   then stopping plasma generation, and
   removing said substrate after stopping plasma generation.

2. The method according to claim 1, wherein before removal of said substrate held on said electrode by an electrostatic clamping force generated by the potential difference between the DC voltage applied to said electrode and the negative self-bias voltage induced in said substrate due to plasma, the potential difference is made zero by controlling said DC voltage before stopping the plasma generation.

3. The method according to claim 2, wherein the DC voltage is made equal to the negative self-bias voltage immediately before stopping the plasma generation.

4. The method according to claim 1, wherein the potential difference between said substrate and said electrode is made zero, and the electrostatic clamping force acting between said substrate and said electrode is made zero immediately before plasma generation is stopped.

5. The method according to claim 1, wherein application of the DC voltage to said electrode is stopped as soon as plasma generation is stopped.

6. The method according to claim 1, wherein the plasma is generated by applying rf between parallel plate electrodes, electron cyclotron resonance (ECR), helicon waves, or inductive coupling.

7. The method of removing a substrate held on an electrode by an electrostatic clamping force generated by a potential difference between a DC voltage applied to said electrode and a negative self-bias voltage induced in said substrate by a plasma, comprising the steps of:
   setting said potential difference to a value which causes no damage to said substrate at the time of removal thereof, by controlling said DC voltage,
   then stopping plasma generation, and
   removing said substrate after stopping plasma generation,
   wherein before removal of said substrate held on said electrode by an electrostatic clamping force generated by the potential difference between the DC voltage applied to said electrode and the negative self-bias voltage induced in said substrate due to a plasma, the potential difference is set to about 100 V or less by controlling said DC voltage before stopping the plasma generation.

8. A method of removing a substrate held on an electrode by an electrostatic clamping force generated by a potential difference between the electrode and a negative self-bias voltage induced in said substrate by a plasma, comprising the steps of:
   making said potential difference zero by applying a DC voltage to said electrode,
   then stopping plasma generation, and
   removing said substrate after stopping plasma generation.

9. The method according to claim 8, wherein a DC voltage equal to the self-bias voltage is applied to said electrode immediately before stopping plasma generation.

10. The method according to claim 8, wherein the potential difference between said substrate and said electrode is made zero, and the electrostatic clamping force acting between said substrate and said electrode is made zero immediately before plasma generation is stopped.

11. The method according to claim 8, wherein application of the DC voltage to said electrode is stopped as soon as plasma generation is stopped.

12. The method according to claim 8, wherein the plasma is generated by applying rf between parallel plate electrodes, electron cyclotron resonance (ECR), helicon waves, or inductive coupling.

13. An apparatus for controlling the voltage applied to an electrostatic clamp having an electrode, comprising:
   means for applying a DC voltage to the electrode for generating an electrostatic clamping force between a substrate and the electrode;
   means for detecting a maximum voltage Vpp of a high frequency for generating plasma;
   means for computing a self-bias voltage Vdc of the substrate based on the maximum high-frequency voltage Vpp; and
   means for controlling the DC voltage output from said DC voltage applying means based on the computed self-bias voltage Vdc.

14. The apparatus for controlling the applied voltage according to claim 13, wherein said output control means sets the DC voltage equal to the computed self-bias voltage immediately before said substrate is completely processed.

15. The apparatus for controlling the applied voltage according to claim 13, wherein said computing means computes the self-bias voltage Vdc in accordance with the equation Vdc=aVpp+b, wherein a and b are constants.

16. The apparatus for controlling the applied voltage according to claim 13, wherein data of Vdc corresponding to Vpp is memorized in said computing means.

17. The apparatus for controlling the applied voltage according to claim 13, wherein said DC voltage applying means has a filter for cutting high frequency waves for plasma generation.

* * * * *